(12) United States Patent
Zhou (10) Patent No.: US 9,941,303 B1
(45) Date of Patent: Apr. 10, 2018

(54) ARRAY SUBSTRATE, DISPLAY PANEL AND DISPLAY DEVICE

(71) Applicant: XIAMEN TIANMA MICRO-ELECTRONICS CO., LTD., Xiamen (CN)

(72) Inventor: Hongbo Zhou, Xiamen (CN)

(73) Assignee: XIAMEN TIANMA MICRO-ELECTRONICS CO., LTD., Xianmen (CN)

( * ) Notice: Subject to any disclaimer, the term of this patent is extended or adjusted under 35 U.S.C. 154(b) by 0 days.

(21) Appl. No.: 15/635,857

(22) Filed: Jun. 28, 2017

(30) Foreign Application Priority Data

Mar. 23, 2017 (CN) .......................... 2017 1 0177811

(51) Int. Cl.
| | |
|---|---|
| *H01L 21/00* | (2006.01) |
| *H01L 27/12* | (2006.01) |
| *G02F 1/1368* | (2006.01) |
| *G02F 1/1362* | (2006.01) |
| *G02F 1/1343* | (2006.01) |

(52) U.S. Cl.
CPC ........ *H01L 27/1218* (2013.01); *G02F 1/1368* (2013.01); *G02F 1/13439* (2013.01); *G02F 1/134309* (2013.01); *G02F 1/136209* (2013.01); *G02F 1/136227* (2013.01); *G02F 1/136286* (2013.01); *G02F 2001/134345* (2013.01); *G02F 2201/123* (2013.01)

(58) Field of Classification Search
CPC ............. G02F 1/1368; G02F 1/136286; G02F 1/134309; G02F 1/13439; G02F 1/136209; G02F 1/136227; H01L 27/1218
See application file for complete search history.

(56) References Cited

U.S. PATENT DOCUMENTS

| | | | | |
|---|---|---|---|---|
| 2010/0289064 | A1* | 11/2010 | Or-Bach | ........... H01L 21/26506 257/209 |
| 2011/0233617 | A1* | 9/2011 | Or-Bach | ........... H01L 21/76254 257/202 |
| 2015/0303150 | A1* | 10/2015 | Choi | ....................... H01L 21/77 257/72 |

\* cited by examiner

*Primary Examiner* — Richard Booth
(74) *Attorney, Agent, or Firm* — Alston & Bird LLP (57) ABSTRACT

The present application provides an array substrate, a display panel and a display device. The array substrate includes: a substrate; gate lines and data lines located on the substrate, intersecting and insulated from each other, which define a plurality of sub-pixel areas; the sub-pixel areas each comprises: a thin-film transistor; a pixel electrode, a barrier metal electrode. An orthographic projection of the drain electrode on the substrate is located between orthographic projections of two adjacent data lines on the substrate, an orthographic projection of the barrier metal electrode on the substrate is located between the orthographic projection of the drain electrode on the substrate and the orthographic projection of at least one of the two adjacent data lines on the substrate.

17 Claims, 9 Drawing Sheets

ARRAY SUBSTRATE, DISPLAY PANEL AND DISPLAY DEVICE

CROSS-REFERENCE TO RELATED APPLICATIONS

The present application claims priority to Chinese Patent Application No. CN201710177811.2, filed on Mar. 23, 2017, the content of which is incorporated herein by reference in its entirety.

TECHNICAL FIELD

The present application relates to the field of display techniques and, particularly, relates to an array substrate, a display panel and a display device.

BACKGROUND

An array substrate is an importance component in a display device. At present, the array substrate includes: a plurality of sub-pixel areas defined by intersecting of a plurality of gate lines and a plurality of data lines; a thin-film transistor and a pixel electrode which are arranged corresponding to each of the sub-pixel areas. A source electrode of the thin-film transistor is connected with the data lines and a drain electrode of the thin-film transistor is connected with the pixel electrode.

There are at least the following problems of the array substrate in prior art:

The resolution of the display device is becoming higher, and the size of the sub-pixel area as well as the distance between the data line and the drain electrode are becoming smaller accordingly. As a result, parasitic capacitance are easily formed between the data lines and the drain electrodes, which may cause crosstalk to the voltage on the pixel electrodes when the voltages on the data lines change, and thus may cause adverse influence on display effect.

SUMMARY

In view of the above, embodiments of the present disclosure provide an array substrate, a display panel and a display device, which can reduce the parasitic capacitance between the data line and the pixel electrode, so as to reduce the crosstalk resulted therefrom and improve the display effect.

In a first aspect, the present disclosure provides an array substrate. The array substrate includes a substrate; a plurality of gate lines located on the substrate; a plurality of data lines located on the substrate; a plurality of sub-pixel areas defined by intersecting of the plurality of gate lines and the plurality of data lines which are insulated from each other; a thin-film transistor arranged corresponding to each of the plurality of sub-pixel areas; a pixel electrode arranged corresponding to each of the plurality of sub-pixel areas; and a barrier metal electrode arranged corresponding to each of the plurality of sub-pixel areas. The thin-film transistor comprises a source electrode, a drain electrode and a gate electrode, the source electrode is connected with one of the plurality of data lines, the drain electrode is connected with the pixel electrode, and the gate electrode is connected with one of the plurality of gate lines; an orthographic projection of the drain electrode on the substrate is located between orthographic projections of two adjacent data lines on the substrate, and an orthographic projection of the barrier metal electrode on the substrate is located between the orthographic projection of the drain electrode on the substrate and the orthographic projection of at least one of the two adjacent data lines on the substrate.

In another aspect, the present disclosure provides a display panel, and the display panel includes the above array substrate.

In another aspect, the present disclosure provides a display device, and the display device includes the above display panel.

In the array substrate, display panel and display device provided by embodiments of the present disclosure, a barrier metal electrode is disposed between the drain electrode and its adjacent data line, and the barrier metal electrode shields the electric field, which reduces the parasitic capacitance between the drain electrode and the data line, so as to reduce the crosstalk resulted therefrom and improve the display effect.

BRIEF DESCRIPTION OF DRAWINGS

The accompanying drawings are introduced to illustrate the embodiments of the present disclosure as follows. The drawings described below are merely part of the embodiments of the present disclosure, other drawings can also be acquired by those skilled in the art without adding creative efforts.

DESCRIPTION OF EMBODIMENTS

In order to better understand the technical solutions of the present disclosure, embodiments of the present disclosure are described in details as below with reference to the accompanying drawings.

It should be noted that, the described embodiments are merely parts of the embodiments of the present disclosure but not all the embodiments. Based on the embodiments in the present disclosure, all other embodiments obtained by those skilled in the art without any creative effort fall into the protection scope of the present disclosure.

The terms used in the embodiments of the present disclosure are merely intended to describe specific embodiments but not to limit the present disclosure. The expression of "a", "the" or "such" in the singular form used in the embodiments and claims of the present disclosure is also intended to include the plural form thereof, unless otherwise noted.

Figure 1:
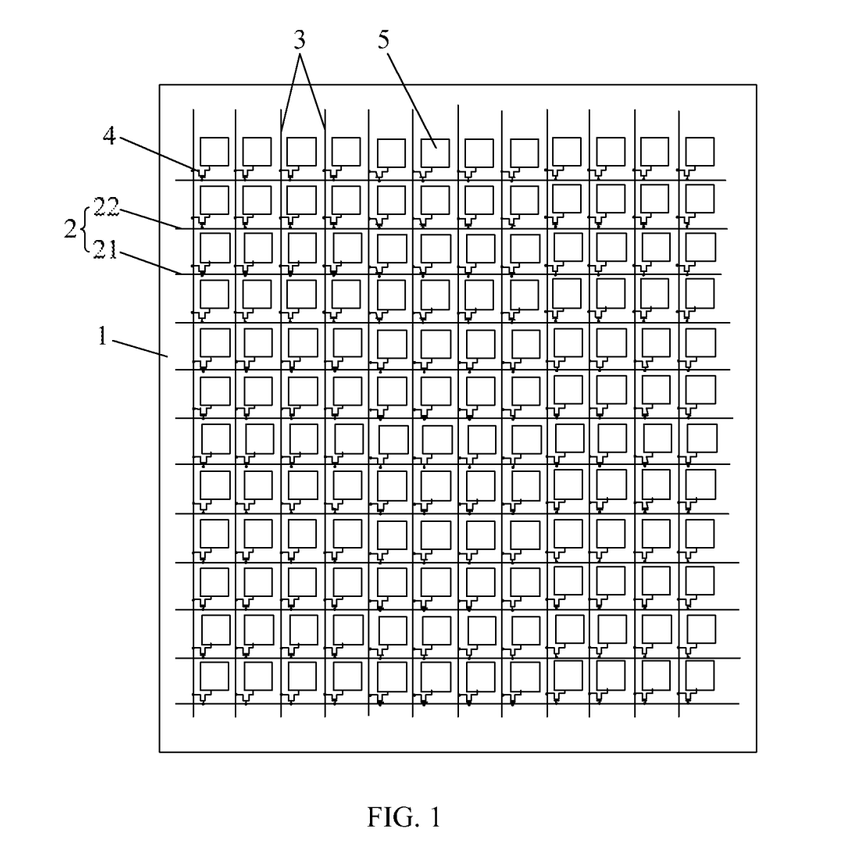
FIG. 1 illustrates a schematic top view diagram of an array substrate according to an embodiment of the present disclosure.
Figure 2:
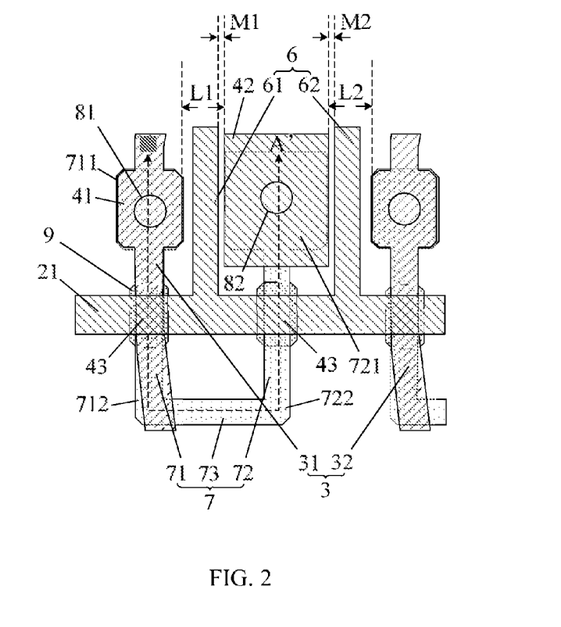
FIG. 2 illustrates a enlarged diagram of a partial area of the array substrate in FIG. 1.
Figure 3:
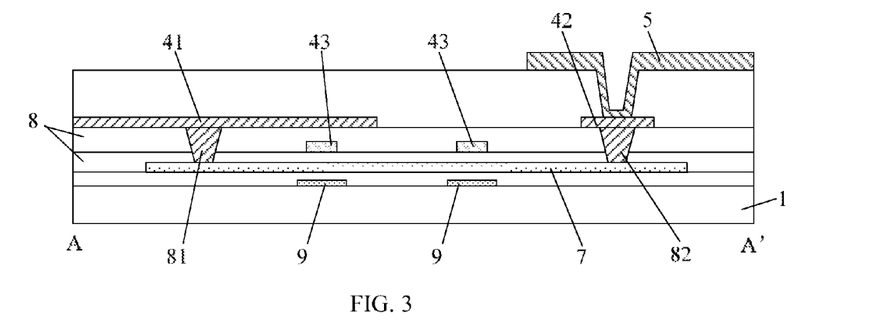
FIG. 3 illustrates a cross sectional diagram of the array substrate along the AN line in FIG. 2.

FIG. 1 is a structural schematic diagram of an array substrate according to an embodiment of the present disclosure, FIG. 2 is an enlarged diagram of a partial area of the array substrate in FIG. 1, FIG. 3 is a cross sectional diagram along the AA' line in FIG. 2. An embodiment of the present disclosure provides an array substrate. The array substrate includes: a substrate 1, a plurality of gate lines 2, a plurality of data lines 3 and a plurality of sub-pixel areas. The plurality of gate lines 2 and the plurality of data lines 3 are located on the substrate 1. The plurality of gate lines 2 and the plurality of data lines 3 intersect but insulated from each other to define the plurality of sub-pixel areas. Each sub-pixel area includes a thin-film transistor 4, a pixel electrode 5 and a barrier metal electrode 6. The thin-film transistor 4 includes a source electrode 41, a drain electrode 42, a gate electrode 43 and an active layer 7. The source electrode 41 is connected with one of the plurality of the data lines 3. In FIG. 2, the source electrode 41 is a part of the signal line 3. As shown in FIG. 3, the source electrode 41 and the drain electrode 42 are located at a source-drain metal layer, an insulating layer 8 is disposed between the source-drain metal layer and the active layer 7. A via hole 81 for source electrode and a via hole 82 for drain electrode are disposed in the insulating layer 8. As shown in FIG. 2, the source electrode 41 is connected with the active layer 7 through the via hole 81 for source electrode, the drain electrode 42 is connected with the active layer 7 through the via hole 82 for drain electrode, and the drain electrode 42 is connected with the pixel electrode 5 (not shown in FIG. 2). The gate electrode 43 is connected with one of the plurality of gate lines 2, in FIG. 2, the gate electrode 43 is a part of one gate line 2, i.e., an overlapping portion of the gate line 2 with the active layer 7. An orthographic projection of the drain electrode 42 on the substrate is located between orthographic projections of two adjacent data lines 3 thereof on the substrate, and an orthographic projection of the barrier metal electrode 6 on the substrate is located between the orthographic projection of the drain electrode 42 on the substrate and an orthographic projection of at least one of the two adjacent data lines 3 on the substrate. The array substrate further includes a light-shading layer 9 located between the active layer 7 and the substrate 1. The light-shading layer 9 is configured to shade a channel area of the active layer 7. The channel area is an overlapping area of an orthographic projection of the gate line 2 on the active layer 7 with the active layer 7. The gate line 2 is configured to transmit a control signal of the thin-film transistor 4, the signal line 3 is configured to transmit a pixel voltage signal needed by the pixel electrode 5. When the array substrate is working, under control of a corresponding gate line 2, the pixel electrode 5 corresponding to the drain electrode 42 will be charged/discharged by the data line 3 corresponding to the source electrode 41 through the thin-film transistor 4, so that an electric field will be formed between the pixel electrode 5 and a common electrode 6, to realize the display function.

Figure 4:
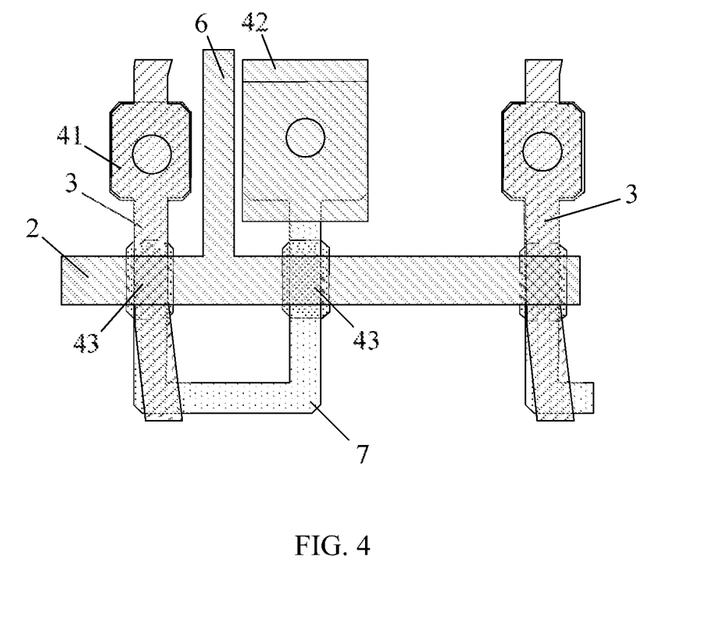
FIG. 4 illustrates another enlarged diagram of a partial area of the array substrate in FIG. 1.

When the substrate is working, an electric field will be generated between the drain electrode 42 and its adjacent data lines 3 and thus parasitic capacitance will be formed between them. However, in an embodiment of the present disclosure, a barrier metal electrode 6 is disposed between the drain electrode 42 and the data lines 3. Therefore, part of the electric field generated between the drain electrode 42 and the data lines 3 will be shielded by the barrier metal electrode 6, so as to reduce the parasitic capacitance between the drain electrode 42 and the data lines 3. In each sub-pixel area, the shape, position and number of the barrier metal electrode 6 can be determined according to demands. For example, FIG. 4 is another enlarged diagram of the partial area of the array substrate in FIG. 1, if the drain electrode 42 is disposed in the sub-pixel area and close to the left side of the sub-pixel area, i.e., the drain electrode 42 is close to the date line 3 at its left side and far away from the date line 3 at its right side, larger parasitic capacitance will be formed between the drain electrode 42 and the data line 3 at the left side while smaller parasitic capacitance will be formed between the drain electrode 42 and the data line 3 at the right side. Accordingly, the barrier metal electrode 6 may be disposed only between the drain electrode 42 and the adjacent data line 3 at the left side thereof, to reduce the parasitic capacitance formed between the drain electrode 42 and the data line 3 at the left side.

In the array substrate according to an embodiment of the present disclosure, a barrier metal electrode is disposed between the drain electrode and its adjacent data line. The barrier metal electrode shields the electric field, which reduce the parasitic capacitance between the drain electrode and the data line, so as to reduce crosstalk resulted therefrom and improve display effect.

Optionally, in each sub-pixel area of the array substrate shown in FIG. 2 and FIG. 3, the barrier metal electrode 6 includes a first barrier metal electrode 61 and a second barrier metal electrode 62. Two adjacent data lines 3 are respectively referred to as a first data line 31 and a second data line 32, between which, an orthographic projection of the first barrier metal electrode 61 on the substrate is located between the orthographic projection of the drain electrode 42 on the substrate and an orthographic projection of the first data line 31 on the substrate, and an orthographic projection of the second barrier metal electrode 62 on the substrate is located between the orthographic projection of the drain electrode 42 on the substrate and an orthographic projection of the second data line 32 on the substrate. In specific polarity-inversion driving modes (e.g. column inversion), when displaying, two adjacent columns of data lines have opposite voltage polarity. Therefore, the first barrier metal electrode 61 and the second barrier metal electrode 62 respectively disposed at the left and right sides of the drain electrode 42 as shown in FIG. 2 and FIG. 3 can further reduce the parasitic capacitance formed at the left and right sides of the drain electrode 42 while guaranteeing that the parasitic capacitance formed at the left and right sides of the drain electrode 42 can be counteracted with each other in a certain extent.

Optionally, as shown in FIG. 2, the first barrier metal electrode 61 and the second barrier metal electrode 62 have the same shape and size, so as to guarantee that the first barrier metal electrode 61 and the second barrier metal electrode 62 can reduce the parasitic capacitance equally at the left and right sides of the drain electrode 42, respectively.

Optionally, as shown in FIG. 2, between the first data line 31 and the second data line 32, a distance L1 between the drain electrode 42 and the first data line 31 is equal to a distance L2 between the drain electrode 42 and the second data line 32, and a distance M1 between the drain electrode 42 and the first barrier metal electrode 61 is equal to a distance M2 between the drain electrode 42 and the second barrier metal electrode 62. When the distance L1 between the drain electrode 42 and the first data line 31 is equal to the distance L2 between the drain electrode 42 and the second data line 32, the parasitic capacitance formed at the left side of the drain electrode 42 will be approximately equal to the parasitic capacitance formed at the right side of the drain electrode 42. Therefore, the distance M1 between the drain electrode 42 and the first barrier metal electrode 61 is set to be equal to the distance M2 between the drain electrode 42 and the second barrier metal electrode 62, so as to further guarantee that the first barrier metal electrode 61 and the second barrier metal electrode 62 can equally reduce the parasitic capacitance at the left side of the drain electrode 42 and the parasitic capacitance at the right side of the drain electrode 42, respectively.

Specifically, according to an optional embodiment, as shown in FIGS. 1-3, in the above array substrate, the active layer 7 includes a first section 71, a second section 72 and third section 73. The orthographic projection of the drain electrode 42 on the substrate is located between orthographic projections of two adjacent gate lines 2 on the substrate. The two adjacent gate lines 2 are respectively referred to as a first gate line 21 and a second gate line 22 (only the first gate line 21 is shown in FIG. 2). The drain electrode 42 is located in a sub-pixel area and at a side of the sub-pixel area close to the first gate line 21. The first section 71 includes a first end 711 and a second end 712 which are oppositely arranged, the second section 72 includes a first end 721 and a second end 722 which are oppositely arranged. An orthographic projection of the first end 711 of the first section 71 and an orthographic projection of the first end 721 of the second section 72 on the substrate are located at a side of the orthographic projection of the first gate line 21 on the substrate close to the orthographic projection of the drain 42 on the substrate, an orthographic projection of the second end 712 of the first section 71, an orthographic projection of the second end 722 of the second section 72 and an orthographic projection of the third section 72 on the substrate are located at a side of the orthographic projection of the first gate line 21 far away from the orthographic projection of the drain 42 on the substrate. The third section 73 is connected with the second end 712 of the first section 71 and with the second end 722 of the second section 72. The first end 711 of the first section 71 is connected with the source electrode 41 through the via hole 81 for source electrode, and the first end 721 of the second section 72 is connected to the drain electrode 42 through the via hole 82 for drain electrode. In such structure, the active layer 7 is structured in a U shape, the thin-film transistor 4 is formed as a double-gate structure, the specific structure of the thin-film transistor 4 in not limited in embodiments of the present disclosure. For example, in some other applicable embodiments, the thin-film transistor 4 may be formed as a single-gate structure.

Figure 5:
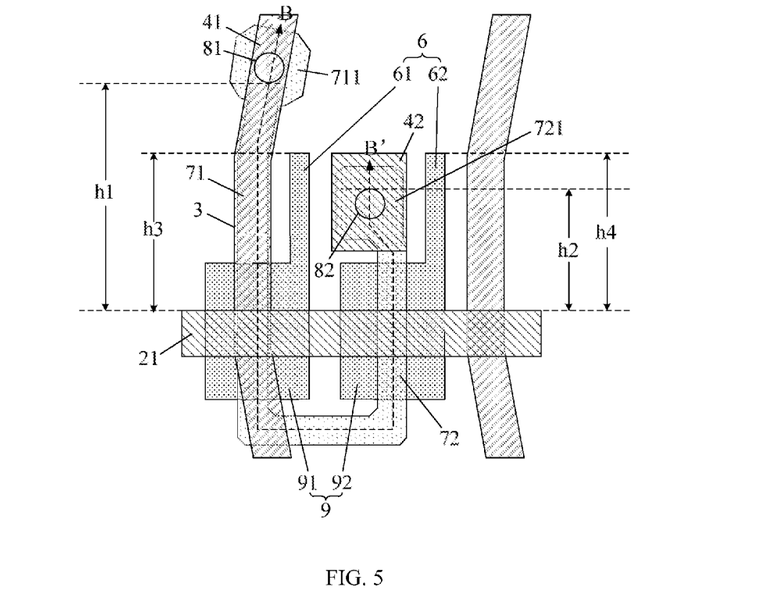
FIG. 5 illustrates another enlarged diagram of a partial area of the array substrate in FIG. 1.
Figure 6:
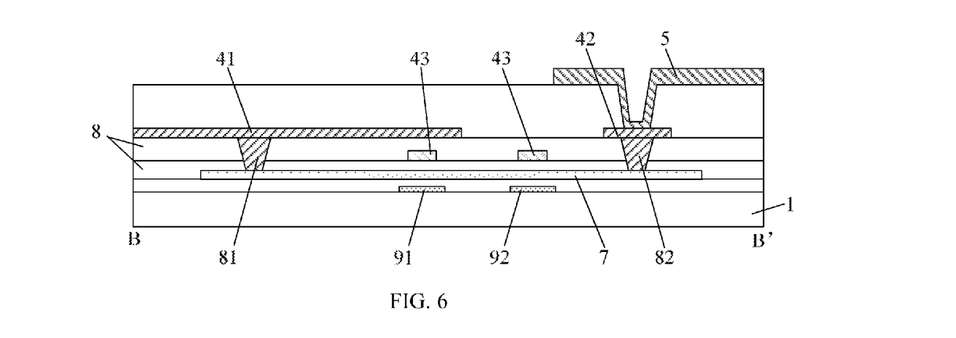
FIG. 6 illustrates a cross sectional diagram of the array substrate along the BB' line in FIG. 5.

Specifically, as shown in FIG. 5 and FIG. 6, FIG. 5 is another enlarged diagram of a partial area of the array substrate in FIG. 1, FIG. 6 is a cross sectional diagram of the array substrate along the BB' line in FIG. 5. The source electrode 41 and the drain electrode 42 are located at a source-drain metal layer, an insulating layer 8 is disposed between the source-drain metal layer and the active layer 7. A via hole 81 for source electrode and a via hole 82 for drain electrode are disposed in the insulating layer 8. The source electrode 41 is connected with the first end 711 of the first section 71 through the via hole 81 for source electrode, the drain electrode 42 is connected with the first end 721 of the second section 72 through the via hole 82 for drain electrode. A distance between the orthographic projection of the via hole 81 for source electrode on the substrate and the orthographic projection of the first gate line 21 on the substrate is h1, a distance between an end of the orthographic projection of the via hole 82 for drain electrode on the substrate far away from the orthographic projection of the first gate line 21 on the substrate and the orthographic projection of the first gate line 21 on the substrate is h2, and h1>h2. When the source electrode 41 is close to the drain electrode 42, the parasitic capacitance formed between the data line 3 and the drain electrode 42 will cause severe crosstalk, for example, in FIG. 2, the source electrode 41 and the drain electrode 42 are arranged in parallel and close to each other, however, in the structure shown in FIG. 5, the source electrode 41 is far away from the drain electrode 42, which reduces the crosstalk caused by the parasitic capacitance.

Optionally, as shown in FIG. 5, a distance between an end of the orthographic projection of the first barrier metal electrode 61 on the substrate far away from the orthographic projection of the first gate line 21 on the substrate and the orthographic projection of the first gate line 21 on the substrate is h3, a distance between an end of the orthographic projection of the second barrier metal electrode 62 on the substrate far away from the orthographic projection of the first gate line 21 on the substrate and the orthographic projection of the first gate line 21 on the substrate is h4, h3>h2 and h4>h2. The barrier metal electrode 6 is located between the drain electrode 42 and the data line 3, so as to guarantee that the barrier metal electrode 6 can reduce the parasitic capacitance formed between the drain electrode 42 and the data line 3.

Further, as shown in FIG. 5, h1>h3, h1>h4, and a top end of the via hole 81 for source electrode is higher than a top end of the barrier metal electrode 6, i.e., the source electrode 41 is far away from the drain electrode 42, thus, no parasitic capacitance will be formed between the source electrode 41 and the drain electrode 42 and it is only necessary to dispose the barrier metal electrode 6 between the data line 3 and the drain electrode 42 rather than between the source electrode 41 and the drain electrode 42. Therefore, the barrier metal electrode 6 can be arranged outside an opening area of the pixel, which will not cause adverse influence on the transmittance of the array substrate.

Figure 7:
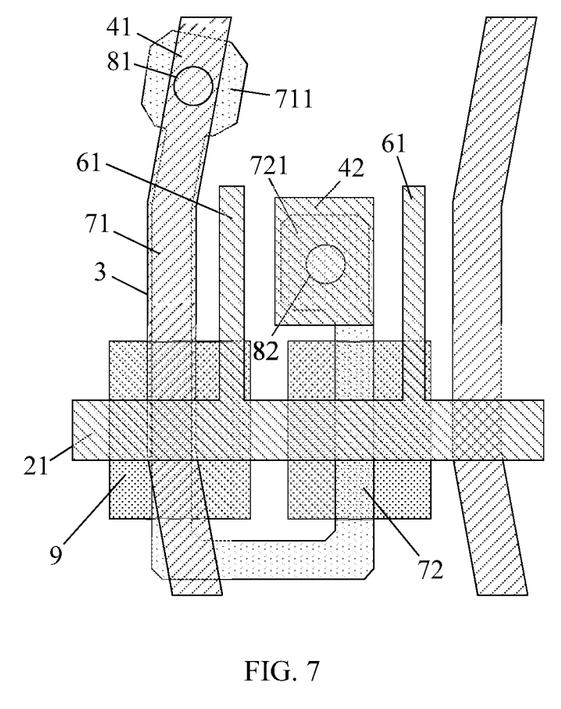
FIG. 7 illustrates another enlarged diagram of a partial area of the array substrate in FIG. 1.

Optionally, as shown in FIG. 2 and FIG. 7, FIG. 7 is another partial enlarged diagram of the partial area of the array substrate in FIG. 1. Both the first barrier metal electrode 61 and the second barrier metal electrode 62 are lateral extensions of the first gate line 21, i.e., the barrier metal electrode 6 is formed during the formation of the gate line 2, so as to simplify the manufacturing process of the barrier metal electrode 6.

In addition to the manner of forming the barrier metal electrode 6 by the gate line 2 as shown in FIG. 2 and FIG. 7, the barrier metal electrode can also be formed in other manners. For example, as shown in FIG. 5 and FIG. 6, the above substrate further includes: a light shading layer 9 located between the active layer 7 and the substrate 1. The orthographic projection of the first gate line 21 on the substrate and the orthographic projection of the first section 71 on the substrate have a first overlapping area, the orthographic projection of the first gate line 21 on the substrate and the orthographic projection of the second section 72 on the substrate have a second overlapping area. The light shading layer 9 includes a first light shading portion 91 and a second light shading portion 92. An orthographic projection of the first shading portion 91 on the substrate covers the first overlapping area, an orthographic projection of the second shading portion 92 on the substrate covers the second overlapping area. The first barrier metal electrode 61 is an extension of the first light shading portion 91, and the second barrier metal electrode 62 is an extension of the second light shading portion 92. The light shading layer 9 is configured to shade the channel area, so as to prevent adverse influence of light on the drain current in the thin-film transistor 4, and the barrier metal electrode 6 is formed during the formation of the light shading layer 9, so as to simplify the manufacturing process of the barrier metal electrode 6.

Figure 8:
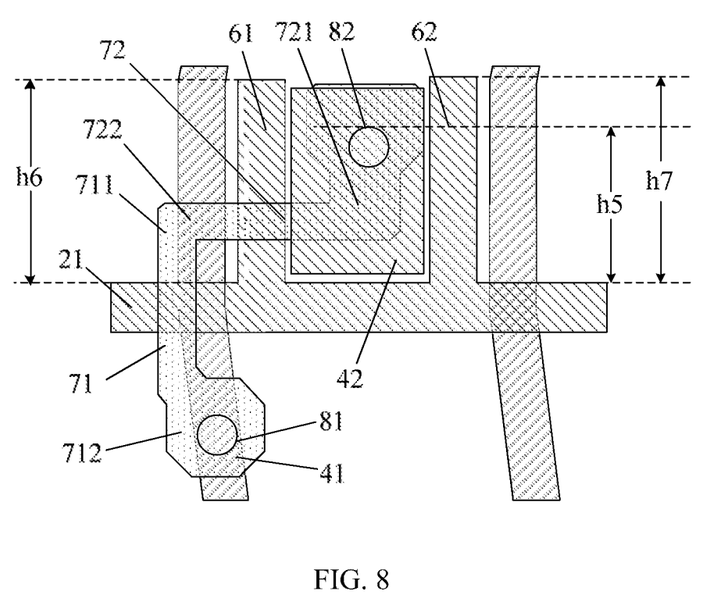
FIG. 8 illustrates another enlarged diagram of a partial area of the array substrate in FIG. 1.

Optionally, in addition to the active layer 7 structured in a U shape above, the active layer 7 can also be structured in other shapes, for example, the active layer 7 can be structured in an L shape shown in FIG. 8, as shown in FIG. 1 and FIG. 8, FIG. 8 is another partial enlarged diagram of the partial area of the array substrate in FIG. 1. The array substrate further includes: an active layer 7. The active layer 7 includes a first section 71 and a second section 72. The orthographic projection of the drain electrode 42 on the substrate is located between orthographic projections of two adjacent gate lines 21 on the substrate. The two adjacent gate lines 21 are respectively referred as a first gate line 21 and a second gate line 22 (only the first gate line 21 is shown in FIG. 8). The drain electrode 42 is located in a sub-pixel area and at a side of the sub-pixel area close to the first gate line 21. The first section 71 includes a first end 711 and a second end 712 which are oppositely arranged, the second section 72 includes a first end 721 and a second end 722 which are oppositely arranged. An orthographic projection of the first end 711 of the first section 71 and an orthographic projection of the second section 72 on the substrate are located at a side of the orthographic projection of the first gate line 21 on the substrate close to the orthographic projection of the drain electrode 42 on the substrate, an orthographic projection of the second end 712 of the first section 71 on the substrate is located at a side of the orthographic projection of the first gate line 21 on the substrate far away from the orthographic projection of the drain electrode 42 on the substrate. The source electrode 41 and the drain electrode 42 are located at a source-drain metal layer, an insulating layer is disposed between the source-drain metal layer and the active layer, a via hole 81 for source electrode and a via hole 82 for drain electrode are disposed in the insulating layer. The source electrode 41 is connected with the second end 712 of the first section 71 through the via hole 81 for source electrode, the drain electrode 42 is connected with the first end 721 of the second section 72 through the via hole 82 for drain electrode, and the first end 711 of the first section 71 is connected with the second end 722 of the second section 72.

Optionally, as shown in FIG. 8, a distance between an end of the orthographic projection of the via hole 82 for drain electrode on the substrate far away from the orthographic projection of the first gate line 21 on the substrate and the orthographic projection of the first gate line 21 on the substrate is h5; a distance between an end of the orthographic projection of the first barrier metal electrode 61 on the substrate far away from the orthographic projection of the first gate line 21 on the substrate and the orthographic projection of the first gate line 21 on the substrate is h6; a distance between an end of the orthographic projection of the second barrier metal electrode 62 on the substrate far away from the orthographic projection of the first gate line 21 on the substrate and the orthographic projection of the first gate line 21 on the substrate is h7, h6>h5, and h7>h5. The barrier metal electrode is located between the drain electrode 42 and the data line 3, so as to guarantee that the barrier metal electrode can reduce the parasitic capacitance formed between the drain electrode 42 and the data line 3.

Optionally, as shown in FIG. 8, both the first barrier metal electrode 61 and the second barrier metal electrode 62 are lateral extensions of the first gate line 21. Under such structure, in FIG. 8, an overlapping portion of the first barrier metal 61 and the active layer also serves as the gate electrode.

Figure 9:
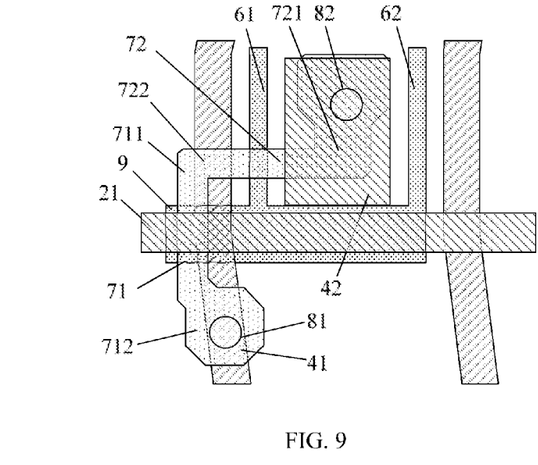
FIG. 9 illustrates another diagram of a partial area of the array substrate in FIG. 1.

Optionally, with the active layer structured in an L shape, in addition to the manner in which the barrier metal electrode is formed by the gate line, the barrier metal can also be formed in other manners. For example, as shown in FIG. 9, FIG. 9 is another partial enlarged diagram of the partial area of the array substrate in FIG. 1. The array substrate further includes: a light shading layer 9 located between the active layer and the substrate. The orthographic projection of the first gate line 21 on the substrate and the orthographic projection of the first section 71 on the substrate have an overlapping area. The light shading layer 9 includes a light shading portion, an orthographic projection of the light shading portion on the substrate covers the overlapping area. The first barrier metal electrode 61 and the second barrier metal electrode 62 are extensions of the light shading portion.

Specifically, as shown in FIG. 2, FIG. 5 and FIGS. 7-9, the first barrier metal electrode 61 and the second barrier metal electrode 62 are structured in a strip-like shape extending along a first direction. The first direction is the extending direction of the data line 3. The barrier metal electrode in such structure can reduce the space occupied by the barrier metal electrode while reducing the parasitic capacitance between the drain electrode 42 and the data line 3, so as to improve the transmittance of the array substrate.

It shall be understood that, the above drawings are merely exemplary, in which the barrier metal electrode is formed by the gate line or the light shading layer. However, embodiments of the present disclosure have no limits thereon, and the barrier metal electrode can also be formed by metals in other layers. For example, if acceptable in processing, the barrier metal electrode can be formed by the source-drain metal layer. However, due to the restriction from the small size of the sub-pixel area, it will be easier to form the barrier metal electrode by other metal layers except for the source-drain metal layer. In addition, FIG. 3 and FIG. 6 only illustrate that the thin-film transistor is a top gate structure, i.e., the gate electrode 43 is located at a side of the active layer 7 far away from the substrate. In the top gate structure, a light shading layer 9 needs to be arranged between the active layer 7 and the substrate 1 so as to shade the channel area of the thin-film transistor, so that the barrier metal electrode can be formed during the formation of the light shading layer 9. If the thin-film transistor is a bottom gate structure, i.e., the gate electrode is located between the active layer and the substrate, since the gate electrode can play a role of shading the channel area of the thin-film transistor, the light shading layer may be not provided in bottom gate structure, and then the barrier metal electrode may be formed in other manners.

The technical effects of the embodiments of the present disclosure are further described by comparison of analog simulation results obtained under different structures:

TABLE 1

|  | Red | Green | Blue | White | Purple | Cyan | Yellow | Black |
|---|---|---|---|---|---|---|---|---|
| Testing position 1 | −0.34% | 1.50% | −1.77% | 0.79% | −1.36% | 0.40% | 1.90% | −0.76% |
| Testing position 2 | −0.05% | −1.07% | 1.32% | −0.16% | 1.13% | 0.04% | −1.27% | 0.13% |

Table 1 shows simulation results of an array substrate without adopting a barrier metal electrode under testing images of different colors. The first row shows the colors of the testing images, the first column shows the testing positions, the contents therein are crosstalk values, a smaller absolute value of the crosstalk value represents less crosstalk, and a greater absolute value of the crosstalk value represents more crosstalk.

TABLE 2

|  | Red | Green | Blue | White | Purple | Cyan | Yellow | Black |
|---|---|---|---|---|---|---|---|---|
| Testing position 1 | −0.42% | 0.94% | −1.21% | 0.79% | −0.88% | 0.46% | 1.28% | −0.76% |
| Testing position 2 | 0.01% | −0.58% | 0.70% | −0.16% | 0.59% | −0.04% | −0.71% | 0.13% |

Table 2 shows simulation results of an array substrate adopting a barrier metal electrode under testing images of different colors. The first row shows the colors of the testing images, the first column shows the testing positions, the contents therein are crosstalk values, a smaller absolute value of the crosstalk value represents less crosstalk, and a greater absolute value of the crosstalk value represents more crosstalk.

Figure 10:
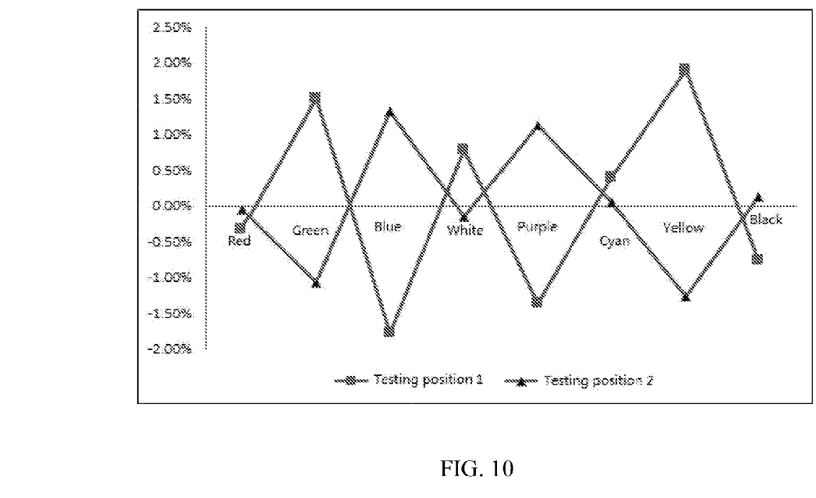
FIG. 10 illustrates a graph of simulation results of an array substrate without adopting a barrier metal electrode under testing images of different colors.
Figure 11:
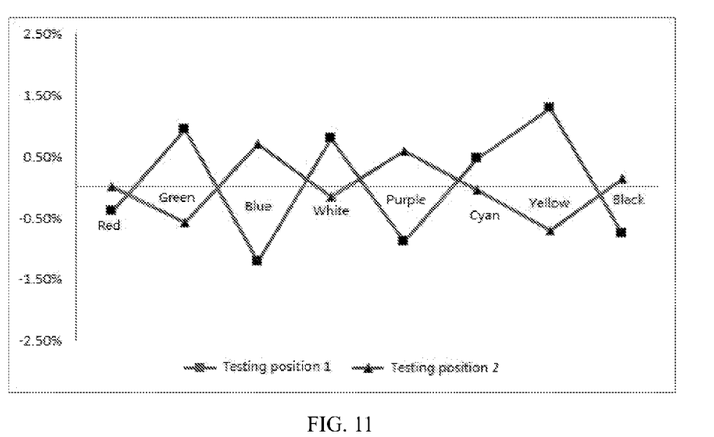
FIG. 11 illustrates a graph of simulation results of an array substrate adopting a barrier metal electrode under testing images of different colors according to an embodiment of the present disclosure.

As shown in Table 1, Table 2, FIG. 10 and FIG. 11, FIG. 10 is a graph of simulation results of an array substrate without adopting a barrier metal electrode under testing images of different colors; FIG. 11 is a graph of simulation results of an array substrate adopting a barrier metal electrode under testing images of different colors. FIG. 10 corresponds to Table 1 and FIG. 11 corresponds to Table 2. The array substrate adopting the barrier metal electrode has reduced crosstalk as compared with the array substrate without adopting the barrier metal electrode. In addition, by means of simulation, the capacitance value between the drain electrode and the data line in the array substrate without adopting the barrier metal electrode is $1.3093589e^{-15}$ Farad, while the capacitance value between the drain electrode and the data line in the array substrate adopting the barrier metal electrode in the present embodiment is $6.4873554e^{-16}$ Farad. Thus, it can be seen that, the array substrate adopting the barrier metal electrode has smaller parasitic capacitance between the drain electrode and the data line as compared with the array substrate without adopting the barrier metal electrode.

Figure 12:
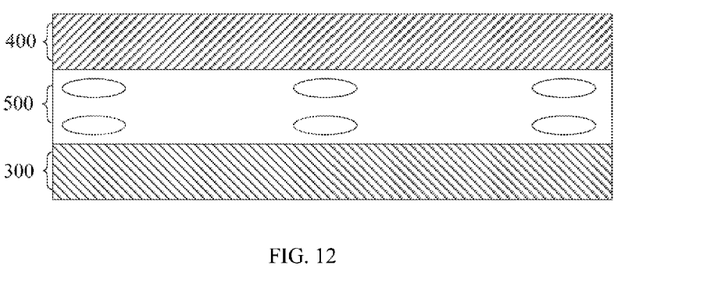
FIG. 12 illustrates a structural schematic diagram of a display panel according to an embodiment of the present disclosure.

As shown in FIG. 12, FIG. 12 is a structural schematic diagram of a display panel according to an embodiment of the present disclosure. An embodiment of the present disclosure further provides a display panel, including the above array substrate 300, a color-film substrate 400 which is arranged opposite to the array substrate 300, and a liquid crystal layer 500 located between the array substrate 300 and the color-film substrate 400. When the display panel is displaying, an electric field will be formed between the pixel electrode on the array substrate 300 and the common electrode, which controls rotation of liquid crystal molecules in the liquid crystal layer 500, so as to realize the display function.

The specific structure and principles of the array substrate 300 are the same as those in the above embodiments, which will not be repeated herein.

In the display panel according to an embodiment of the present disclosure, a barrier metal electrode is disposed between the drain electrode and its adjacent data line, and the barrier metal electrode shields the electric field, which reduces the parasitic capacitance between the drain electrode and the data line, so as to reduce the crosstalk resulted therefrom and improve display effect.

Figure 13:
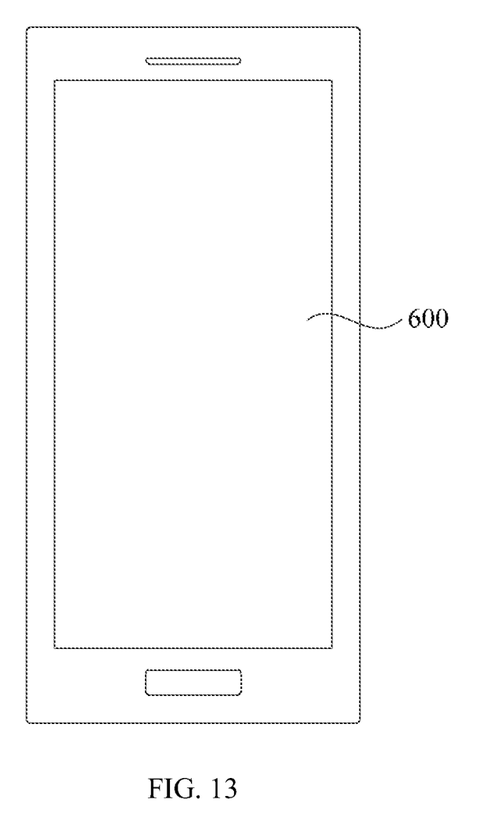
FIG. 13 illustrates a structural schematic diagram of a display device according to an embodiment of the present disclosure.

As shown in FIG. 13, FIG. 13 is a structural schematic diagram of a display device according to an embodiment of the present disclosure. An embodiment of the present disclosure provides a display device, including the above-mentioned display panel 600.

The specific structure and principles of the display panel 600 are the same as those in the above embodiment, which will not be repeated herein. The display device may be any electronic device having display function, for example, touch screens, cell phones, tablet computers, laptops, electronic books or TV sets, etc.

In the display device according to an embodiment of the present disclosure, a barrier metal electrode is disposed between the drain electrode and its adjacent data line, and the barrier metal electrode shields the electric field, which reduces the parasitic capacitance between the drain electrode and the data line, so as to reduce the crosstalk resulted therefrom and improve display effect.

The above are merely preferred embodiments of the present disclosure, which are not used to limit the present disclosure. All the modifications, equivalent substitutions and improvements made within the spirit and principles of the present disclosure shall fall into the protection scope of the present disclosure.

What is claimed is:

1. An array substrate, comprising:
   a substrate;
   a plurality of gate lines located on the substrate;
   a plurality of data lines located on the substrate, intersecting and insulated from the plurality of gate lines, wherein the plurality of gate lines and the plurality of data lines defined a plurality of sub-pixel areas;

wherein the plurality of sub-pixel areas each comprises:
a thin-film transistor;
a pixel electrode; and
a barrier metal electrode;
wherein the thin-film transistor comprises a source electrode, a drain electrode and a gate electrode, wherein the source electrode is connected with one of the plurality of data lines, the drain electrode is connected with the pixel electrode, and the gate electrode is connected with one of the plurality of gate lines; and
wherein an orthographic projection of the drain electrode on the substrate is located between orthographic projections of two adjacent data lines on the substrate, and an orthographic projection of the barrier metal electrode on the substrate is located between the orthographic projection of the drain electrode on the substrate and the orthographic projection of at least one of the two adjacent data lines on the substrate.

2. The array substrate according to claim 1, wherein
in each of the plurality of sub-pixel areas, the barrier metal electrode comprises a first barrier metal electrode and a second barrier metal electrode;
two adjacent data lines of the plurality of data lines comprise a first data line and a second data line;
between the first data line and the second data line, an orthographic projection of the first barrier metal electrode on the substrate is located between the orthographic projection of the drain electrode on the substrate and an orthographic projection of the first data line on the substrate, and an orthographic projection of the second barrier metal electrode on the substrate is located between the orthographic projection of the drain electrode on the substrate and an orthographic projection of the second data line on the substrate.

3. The array substrate according to claim 2, wherein
the first barrier metal electrode and the second barrier metal electrode have a same shape and a same size.

4. The array substrate according to claim 3, wherein
a distance between the drain electrode and the first data line is equal to a distance between the drain electrode and the second data line, and a distance between the drain electrode and the first barrier metal electrode is equal to a distance between the drain electrode and the second barrier metal electrode.

5. The array substrate according to claim 2, further comprising
an active layer, the active layer comprising a first section, a second section and a third section; wherein the orthographic projection of the drain electrode on the substrate is located between orthographic projections of two adjacent gate lines on the substrate;
wherein the two adjacent gate lines comprises a first gate line and a second gate line;
wherein the drain electrode is located in a portion of the sub-pixel area close to the first gate line;
wherein the first section comprises a first end and a second end, the second end is opposite to the first end, and wherein the second section comprises a first end and a second end, the second end of the second section is opposite to the first end of the second section, wherein an orthographic projection of the first end of the first section and an orthographic projection of the first end of the second section on the substrate are located at a side of the orthographic projection of the first gate line on the substrate close to the orthographic projection of the drain electrode on the substrate, and an orthographic projection of the second end of the first section, an orthographic projection of the second end of the second section and an orthographic projection of the third section on the substrate are located at a side of the orthographic projection of the first gate line on the substrate away from the orthographic projection of the drain electrode on the substrate;
wherein the third section is connected with the second end of the first section and the second end of second section; and
wherein the first end of the first section is connected with the source electrode, and the first end of the second section is connected with the drain electrode.

6. The array substrate according to claim 5,
wherein the source electrode and the drain electrode are located at a source-drain metal layer, an insulating layer is placed between the source-drain metal layer and the active layer, the insulating layer comprises a via hole for source electrode and a via hole for drain electrode, the source electrode is connected with the first end of the first section through the via hole for source electrode, and the drain electrode is connected with the first end of the second section through the via hole for drain electrode; and
wherein a distance between an orthographic projection of the via hole for source electrode on the substrate and the orthographic projection of the first gate line on the substrate is defined as h1, and a distance between an end of an orthographic projection of the via hole for drain electrode on the substrate away from the orthographic projection of the first gate line on the substrate and the orthographic projection of the first gate line on the substrate is defined as h2, h1>h2.

7. The array substrate according to claim 5, wherein
both the first barrier metal electrode and the second barrier metal electrode are lateral extensions of the first gate line.

8. The array substrate according to claim 6, further comprising:
a light shading layer located between the active layer and the substrate;
wherein the orthographic projection of the first gate line on the substrate and an orthographic projection of the first section on the substrate have a first overlapping area, and the orthographic projection of the first gate line on the substrate and an orthographic projection of the second section on the substrate have a second overlapping area;
wherein the light shading layer comprises a first light shading portion and a second light shading portion, wherein an orthographic projection of the first light shading portion on the substrate covers the first overlapping area, an orthographic projection of the second light shading portion on the substrate covers the second overlapping area, wherein the first barrier metal electrode comprises an extension of the first light shading portion, and wherein the second barrier metal comprises an extension of the second light shading portion.

9. The array substrate according to claim 6, wherein
a distance between an end of the orthographic projection of the first barrier metal electrode on the substrate away from the orthographic projection of the first gate line on the substrate and the orthographic projection of the first gate line on the substrate is defined as h3, a distance between an end of the orthographic projection of the second barrier metal electrode on the substrate far away from the orthographic projection of the first gate line on the substrate and the orthographic projection of the first gate line on the substrate is defined as h4, wherein h3>h2, and h4>h2.

10. The array substrate according to claim 9, wherein h1>h3, and h1>h4.

11. The array substrate according to claim 2, further comprising
an active layer, the active layer comprising a first section and a second section;
wherein the orthographic projection of the drain electrode on the substrate is located between orthographic projections of two adjacent gate lines on the substrate;
wherein the two adjacent gate lines are respectively a first gate line and a second gate line;
wherein the drain electrode is located in a portion of the sub-pixel area to the first gate line;
wherein the first section comprises a first end and a second end, the second end is opposite to the first end, wherein the second section comprises a first end and a second end, the second end of the second section is opposite to the first end of the second section, wherein an orthographic projection of the first end of the first section and an orthographic projection of the second section on the substrate are located at a side of the orthographic projection of the first gate line on the substrate close to the orthographic projection of the drain electrode on the substrate, an orthographic projection of the second end of the first section on the substrate is located at a side of the orthographic projection of the first gate line on the substrate away from the orthographic projection of the drain electrode on the substrate; and
wherein the source electrode and the drain electrode are located at a source-drain metal layer, wherein an insulating layer is disposed between the source-drain metal layer and the active layer, wherein the insulating layer comprises a via hole for source electrode and a via hole for drain electrode, the source electrode is connected with the second end of the first section through the via hole for source electrode, the drain electrode is connected with the first end of the second section through the via hole for drain electrode, and the first end of the first section is connected with the second end of the second section.

12. The array substrate according to claim 11, wherein both the first barrier metal electrode and the second barrier metal electrode are lateral extensions of the first gate line.

13. The array substrate according to claim 11, further comprising:
a light shading layer located between the active layer and the substrate;
wherein the orthographic projection of the first gate line on the substrate and an orthographic projection of the first section on the substrate cooperatively form an overlapping area; and
wherein the light shading layer comprises a light shading portion, wherein an orthographic projection of the light shading portion on the substrate covers the overlapping area, and both the first barrier metal electrode and the second barrier metal electrode are extensions of the light shading portion.

14. The array substrate according to claim 11, wherein a distance between an end of an orthographic projection of the via hole for drain electrode on the substrate far away from the orthographic projection of the first gate line on the substrate and the orthographic projection of the first gate line on the substrate is defined as h5; and
wherein a distance between an end of the orthographic projection of the first barrier metal electrode on the substrate far away from the orthographic projection of the first gate line on the substrate and the orthographic projection of the first gate line on the substrate is h6, and wherein a distance between an end of the orthographic projection of the second barrier metal electrode on the substrate away from the orthographic projection of the first gate line on the substrate and the orthographic projection of the first gate line on the substrate is defined as h7, wherein h6>h5 and h7>h5.

15. The array substrate according to claim 2, wherein the first barrier metal electrode and the second barrier metal electrode are stripes extending along a first direction, and the first direction is an extending direction of the data lines.

16. A display panel, comprising an array substrate, wherein the array substrate comprises:
a substrate;
a plurality of gate lines located on the substrate;
a plurality of data lines located on the substrate;
a plurality of sub-pixel areas defined by insulated intersecting of the plurality of gate lines and the plurality of data lines;
a thin-film transistor arranged corresponding to each of the plurality of sub-pixel areas;
a pixel electrode arranged corresponding to each of the plurality of sub-pixel areas; and
a barrier metal electrode arranged corresponding to each of the plurality of sub-pixel areas,
wherein the thin-film transistor comprises a source electrode, a drain electrode and a gate electrode, the source electrode is connected with one of the plurality of data lines, the drain electrode is connected with the pixel electrode, and the gate electrode is connected with one of the plurality of gate lines; an orthographic projection of the drain electrode on the substrate is located between orthographic projections of two adjacent data lines on the substrate, and wherein an orthographic projection of the barrier metal electrode on the substrate is located between the orthographic projection of the drain electrode on the substrate and the orthographic projection of at least one of the two adjacent data lines on the substrate.

17. A display device, comprising a display panel, wherein the display panel comprises an array substrate, and the array substrate comprises:
a substrate;
a plurality of gate lines located on the substrate; and
a plurality of data lines located on the substrate, intersecting and insulated from the plurality of gate lines, wherein the plurality of gate lines and the plurality of data lines defined a plurality of sub-pixel areas;
wherein the plurality of sub-pixel areas each comprises:
a thin-film transistor;
a pixel electrode; and
a barrier metal electrode;
wherein the thin-film transistor comprises a source electrode, a drain electrode and a gate electrode, the source electrode is connected with one of the plurality of data lines, the drain electrode is connected with the pixel electrode, and the gate electrode is connected with one of the plurality of gate lines; and wherein an orthographic projection of the drain electrode on the substrate is located between orthographic projections of two adjacent data lines on the substrate, and wherein an orthographic projection of the barrier metal electrode on the substrate is located between the orthographic projection of the drain electrode on the substrate and the orthographic projection of at least one of the two adjacent data lines on the substrate.

\* \* \* \* \*